United States Patent [19]

Kano et al.

[11] 4,064,525

[45] Dec. 20, 1977

[54] NEGATIVE-RESISTANCE SEMICONDUCTOR DEVICE

[75] Inventors: Gota Kano, Nagaoka-kyo; Naoyuki Tsuda, Kyoto; Hitoo Iwasa, Takatsuki, all of Japan

[73] Assignee: Matsushita Electric Industrial Co., Ltd., Kadoma, Japan

[21] Appl. No.: 696,389

[22] Filed: June 15, 1976

Related U.S. Application Data

[63] Continuation of Ser. No. 498,212, Aug. 16, 1974, abandoned.

[30] Foreign Application Priority Data

Aug. 20, 1973 Japan .................................. 48-93568
Aug. 30, 1973 Japan .................................. 48-97984

[51] Int. Cl.² ......................................... H01L 27/02
[52] U.S. Cl. ..................................... 357/42; 357/13; 357/22; 357/57; 357/89
[58] Field of Search .................... 357/42, 43, 13, 89, 357/57, 22

[56] References Cited

U.S. PATENT DOCUMENTS

| 3,440,503 | 4/1969 | G allagher et al. | 357/42 |
|---|---|---|---|
| 3,447,046 | 5/1969 | Cricchi et al. | 357/42 |
| 3,450,963 | 6/1969 | Tsai | 357/42 |
| 3,461,361 | 8/1969 | Delivorias | 357/42 |
| 3,602,781 | 8/1971 | Hart | 357/42 |
| 3,619,740 | 11/1971 | Nakanuma et al. | 357/42 |
| 3,628,070 | 12/1971 | Heuner et al. | 357/42 |
| 3,638,079 | 1/1972 | Chan | 357/42 |
| 3,639,813 | 2/1972 | Kamoshida et al. | 357/42 |

OTHER PUBLICATIONS

L. Hill et al., "Synthesis of Electronic Bistable Circuits," IEEE Trans. on Cir. Theory, Mar. 1963, pp. 25-35.
S. Ostefjells, "Neg. Res. Ckt. Using Two Compl. FETs," Proc. IEEE, vol. 53, No. 4, Apr. 1965, p. 404.
H. Lehman et al. "Form. of Depl. and Enhance mode FETs," IBM Tech. Discl. Bull., vol. 8, No. 4, Sept. 1965, pp. 675, 676.

*Primary Examiner*—Stanley D. Miller, Jr.
*Assistant Examiner*—Joseph E. Clawson, Jr.
*Attorney, Agent, or Firm*—Cushman, Darby & Cushman

[57] ABSTRACT

A pair of field-effect transistors (hereinafter referred to as FETs) of p-channel type and n-channel type, respectively, both to be electrically actuated in a depletion mode, are formed on a single semiconductor substrate, for instance, a single silicon substrate, and both sources or both drains are connected to each other, or the source of one FET and the drain of the other FET are connected to each other, whereby the pair of FETs are series-connected, and the gate electrode of each FET is connected to the drain electrode or the source electrode that is not series connected in the abovementioned way, respectively, of the other FET. When a voltage of specified range is applied across both non-series-connected electrodes, i.e., the two external terminals, the resulting voltage-current characteristic presents a so-called dynatron-type characteristic, producing a negative-resistance phenomenon over a fairly wide range of applied voltage.

Since this device is, as seen from outside as one device, a two-terminal device constituted on a single substrate, it is not only fit to be highly integrated, but also able to produce a state of virtually zero value of cut-off current. Consequently, this device can be utilized for switching, memorization, large amplitude oscillation, and other various uses.

5 Claims, 11 Drawing Figures

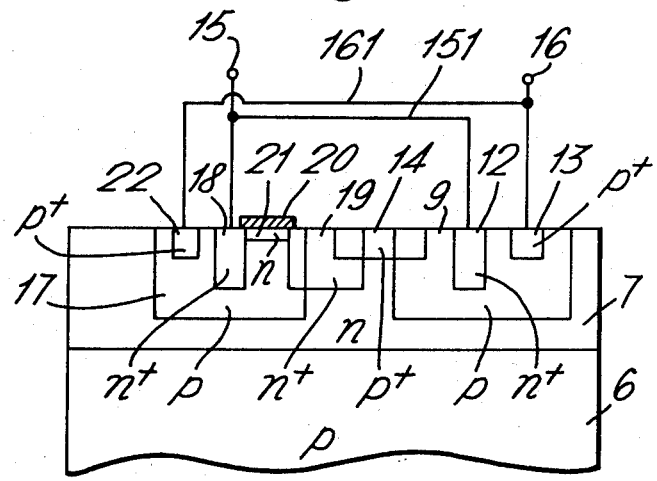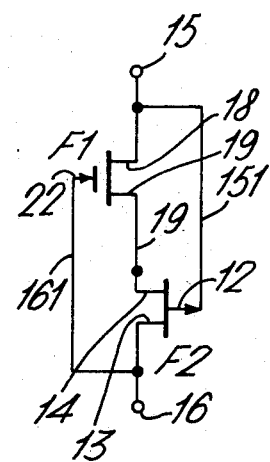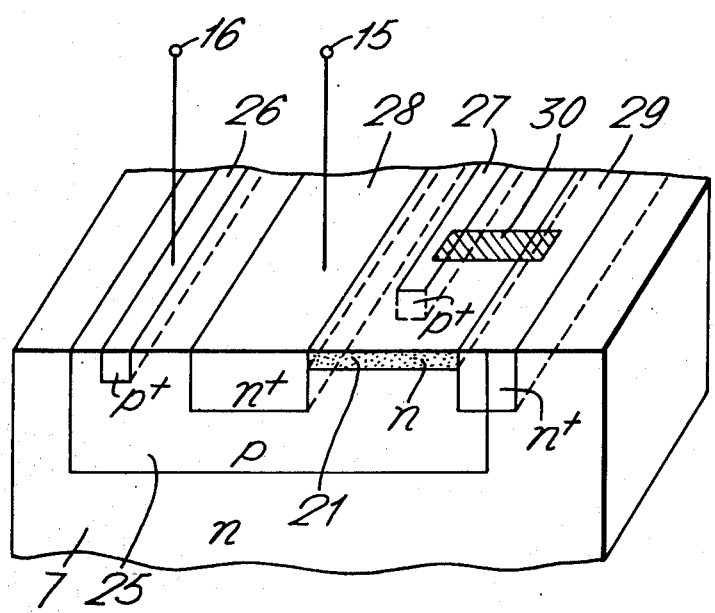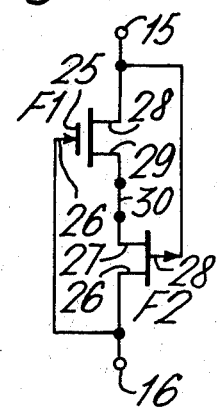

NEGATIVE-RESISTANCE SEMICONDUCTOR DEVICE

This is a continuation of application Ser. No. 498,212, filed Aug. 16, 1974, now abandoned.

BACKGROUND OF THE INVENTION

This invention relates to an improved negative-resistance semiconductor device comprising complementary field-effect transistors (hereinafter referred to as FETs), and particularly concerns a unitary circuit cell of two-terminal device (as seen from outside) bearing complementary field-effect transistors in a single substrate.

Conventional negative-resistance semiconductor devices, are known in which a single-element type is realized by a physical mechanism and in which a composite type is composed of a plural number of discrete semiconductor elements wired together to form a circuit. The former type is best represented by that showing N-figured negative-resistance characteristic such as tunnel diodes, Gunn diodes, etc. and that showing S-figured negative-resistance characteristics such as thyristers, uni-junction transistors, etc. The latter type is best represented by a flip-flop circuit showing S-figure characteristics or a circuit composed of a serially connected pair of complementary field-effect transistors showing N-figured characteristics, as shown in FIG. 1.

Out of the above mentioned known devices, that showing the S-figured characteristic is in wide practical use now, but that showing the N-figured characteristic is used only for special uses. The main reason therefore is that in the conventional N-figured negative-resistance single element realized by the physical mechanism of the tunnel diode, Gunn diode, etc. of the former type, the electric current in the OFF state (or in the valley range of the N-figured characteristic) is relatively large, and hence, essentially complete cut-off of current is not realizable. Moreover, in the circuit formed by the series connection of a pair of complementary field-effect transistors of the latter type, the difficulty of integrating on tiny single-tips is a major drawback.

SUMMARY OF THE INVENTION

The primary object of this invention is to provide a device having a dynatron type characteristic and leaking very little current in the higher voltage stable range (so-called cut-off current), namely, a virtually complete cut-off current characteristic, in the form of a composite circuit integrating complementary field-effect transistors on a single substrate.

The second object of this invention is to realize a tiny integrated circuit element occupying very small area of the substrate per single unit cell, and hence, to provide a negative-resistance semiconductor device having a high density.

This invention provides a device having a circuit constitution wherein two complementary field-effect transistors, both with depletion modes, formed on a single substrate are series-connected to each other, and the gate electrode of each FET is connected to the non-series-connected source or drain of the other FET, and vice versa. These connections are preferably made by partly superposing the electrode regions to be connected to each other, or by so designing that a certain region works functionally as one electrode of an FET and also as another electrode of the other FET.

In the foregoing, the series-connections of complementary FETs means series-connections of channels of the complementary transistors by connecting the respective source electrodes of the n-channel type transistor and of the p-channel type transistor, or the respective drain electrodes of both transistors, or the source electrode of one transistor with the drain electrode of the other transistor. On the other hand, the non-series-connected electrodes mean electrodes of the FETs not series-connected like in the foregoing manners. For example, when both source electrodes of both transistors are connected to each other, the drain electrodes of both transistors fall in this latter category.

In the device of this invention, the internal connections for the circuit constitution are made by mutual contact or partial superposing between the specified conductive regions formed in the semiconductor substrate and also by using electrode layers of electrically conducting metals such as Al, Au, etc. Therefore, said device constitutes essentially the so-called two-terminal circuit device wherein the external terminals, namely, the input terminals for the input voltage are the pair of non-series-connected electrodes.

BRIEF DESCRIPTION OF THE DRAWINGS

FIG. 4 is a cross-sectional view of another example embodying this invention.

FIG. 4a is an equivalent circuit diagram of the example of FIG. 4.

FIG. 5 is a fragmental perspective view of an example of another constitution embodying this invention.

FIG. 5a is an equivalent circuit diagram of the example of FIG. 5.

DETAILED DISCLOSURE OF THE INVENTION

Figure 1:
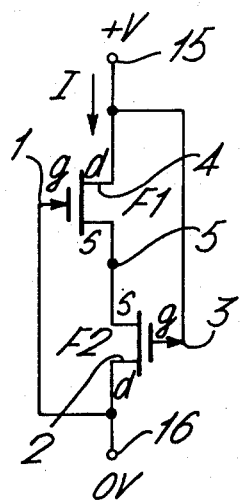
FIG. 1 is an equivalent circuit diagram explaining the theory of this invention.

As shown by the equivalent network constitution of FIG. 1, the negative-resistance semiconductor device of this invention comprises, as a circuit characteristic, a pair of serially connected FETs F1 and F2 electrically actuated in a depletion mode and differing in the type of their conductive channels from each other, so-called complementary field-effect transistors. This particular circuit is old and described for example in *IEEE Transactions on Circuit Theory*, March 1963, pages 25–35 and *Proceedings of the IEEE*, April, 1965, page 404.

FIG. 1 shows a circuit example as disclosed in the prior art in which the gate electrode 1 of an n-channel type FET F1 is connected to the drain electrode 2 of a p-channel type FET F2, and the gate electrode 3 of the p-channel type FET F2 is connected to the drain electrode 4 of the n-channel type FET F1. Both source electrodes of both FETs F1 and F2 are further series-connected to each other at a junction 5.

To observe them from the constitutional characteristic, complementary FETs both actuated in depletion mode are formed on the principal face of a semiconductor substrate of a specified conductivity type, and the regions of both drains or of both sources or between one drain and the other source of the pair of comlementary FETs are contacted or superposed to series-connect them, and finally, each gate is connected by evaporated aluminum film or gold film or through functional integration method as mentioned below to the electrode not series-connected as above of the other complementary FET.

Figure 2:
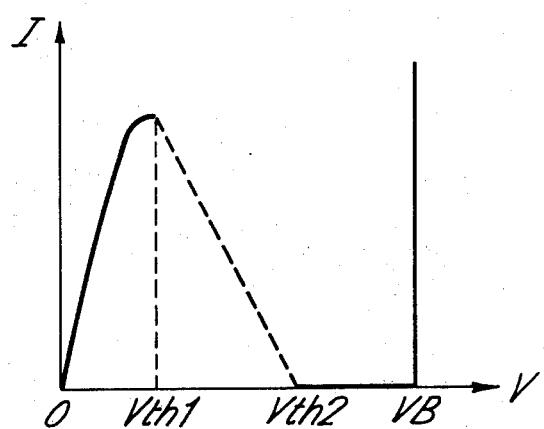
FIG. 2 is a typical voltage-current characteristic chart of the device of this invention.

When a voltage V is applied across one drain electrode 4 and the other drain electrode 2 of the series-connected pair of FETs F1 and F2 (with positive potential on the side of electrode 4), a current-voltage characteristic as shown in FIG. 2 is obtained between voltage V and a source current I. As is seen in FIG. 2, for a time from the starting voltage 0, the current I increases showing positive resistance characteristic as the voltage increases, but the current also shows gradually a saturation characteristic, and after the current exceeds the voltage of the peak current point, namely, the first threshold voltage V$th$1, namely, in the region indicated by the broken line, the current acutely declines as the voltage increases, showing a so-called negative-resistance characteristic. Finally, when the voltage reaches the second threshold voltage V$th$2, the current I enters the cut-off state. This cut-off state of the current continues until the voltage reaches VB point where one of the FETs begins to break-down. When the voltage passes over the VB point, a break-down current is produced. In the circuit constitution of FIG. 1, there are the first stable region of $0 < V \leq V th1$, and the second stable region of $Vth2 \leq V < VB$, and the unstable state lies in the applied voltage range of $Vth1 < V < Vth2$.

Figure 3:
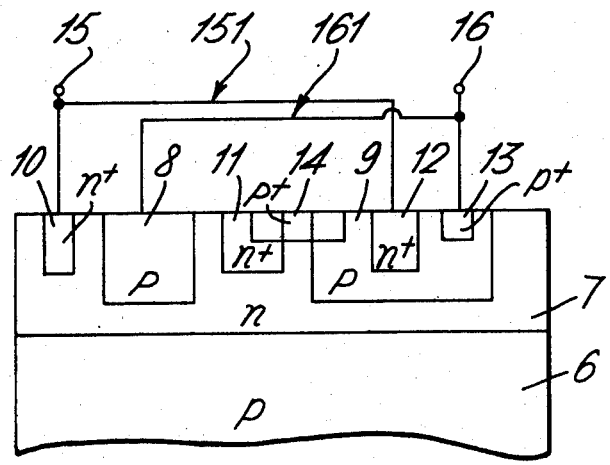
FIG. 3 is a cross-sectional view of one example embodying this invention.

FIG. 3 is a cross-sectional view of an example of the structure proposed by the present invention. In FIG. 3, on a silicone substrate 6 of p-type conductivity having specific resistivity of 10-30Ωcm, an n-type epitaxial growth layer 7 of about 1.5$\mu$ thickness having specific resistivity of 2-4Ωcm is formed. P-type diffused regions 8 and 9 of about 1 $\mu$ depth and having surface impurity concentrations of about $5 \times 10^{16}$ cm$^{-3}$, respectively, are formed in the n-type region 7. In this n-type epitaxial growth region 7, n+-type diffused regions 10 and 11 have depth of about 0.5$\mu$ are formed on both sides of the p-type region 8. Also another n+-type region 12 having depth of about 0.5$\mu$ is formed in the p-type region 9, and a pair of p+-type regions 13 and 14 of about 0.3$\mu$ depth are formed on both sides of the n+ region 12 in the p-type region 9. Moreover, the p+-type diffused region 14 is so designed as to reach and be superposed on a part of the n+-region 11. Then, the gate region 12 is electrically connected to the drain region 10, and the gate region 8 is electrically connected to the drain region 13, by evaporated aluminum or gold films 151 and 161 respectively which are schematically illustrated.

Figure 3A:
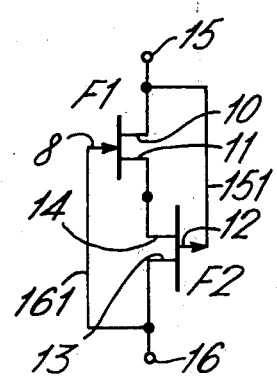
FIG. 3a is an equivalent circuit diagram of the example of FIG. 3.

In the abovementioned arrangement, as shown in FIG. 3a, an n-channel type FET F1 is constituted with an n+-type drain region 10, an n+-type source region 11 and a p-type junction gate region 8, and a p-channel type FET F2 is constituted with a p+-type drain region 13, a p+-type source region 14 and an n-type junction gate region 12. The first and second FETs F1 and F2 are connected in series, with their source regions 11 and 14 being partly superposed. Since the source regions 11 and 14 are highly-doped high-conductivity regions, although they are of opposite conductivity type to each other, they form a good ohmic contact inbetween.

The abovementioned constitution has the following advantages:

1. The p-type diffused junction gate region 8 in the n-channel FET F1 and the p-type diffused channel region 9 in the p-channel FET F2 can be formed at the same time. Also, the n+-type diffused source region 10, the n$^{30}$-type diffused drain region 11 in the n-channel FET F1 and the n+-type diffused junction gate region 12 in the p-channel FET F2 can be made at the same time. Thus, the manufacturing process is relatively simple.

2. There is no need of isolating, i.e., electrically insulating the n-channel type FET F1 and the p-channel type FET F2 from each other, since they are suitably connected at their source regions 11 and 14. Therefore, the diffused isolation region, which has been hitherto necessitated for such integrated circuit, can be omitted, minimizing the area which must be used on the substrate and also decreasing the number of manufacturing steps.

3. Since series connection of the FETs F1 and F2 is made by partly overlapping the p+-type diffused region 11 and the n+-type diffused region 14, there is no need of extra space for the series connection, and therefore, the actual space required for the composite circuit can be decreased.

4. Parameters V$th$1 and V$th$2 of the negative-resistance characteristics can be desirably designed by controlling conditions during diffusion, and therefore, a device of a desired characteristic can be obtained.

In the manufacture of the abovementioned device, the order of the above steps can be changed suitably. For instance, diffusion for making the p-type diffused region 8 of the junction gate of the n-channel FET F1 can be carried on simultaneously with the diffusion for making the p+-type diffused drain region 13 and the p+-type diffused source region 14.

One example of the performance characteristic of the device of the abovementioned first example is as follows:

| | |
|---|---|
| Vth1: | 0.7V–3.0V |
| Vth2: | 3V–12V |
| Maximum current: | 0.05mA–1.0mA |
| Cut-off current: | below 10$^{-9}$A |
| VB: | about 25V |

FIG. 4 is a cross-sectional view of another example of structure proposed by the present invention. In this example, the device comprises an n-channel type FET F1 having a surface inversion region as its channel region and a p-channel type FET having an ordinary diffused p-type region as its p-channel region. In FIG. 4 a silicon substrate 6 of p-type conductivity having specific resistivity of 10-30Ωcm, an n-type epitaxial growth layer 7 of about 1.5$\mu$ thickness having specific resistivity of 2-4Ωcm is formed. In the n-type region 7, p-type regions 9 and 17, both having surface impurity concentrations of about $5 \times 10^{16}$cm$^{-3}$, are formed. In the n-type region 9, an n+-type diffused junction gate region 12, a p+-type diffused drain region 13 and a p+-type diffused source region 14 are formed to constitute a junction gate type n-channel FET F1. In the p-type region 17, an n+-type diffused drain region 18 and an n+-type diffused source region 19 are formed. And on the substrate surface at a part between the drain region 18 and the source region 19, is formed a silicon dioxide layer 20 spanning across the regions 18 and 19, so that a surface inversion layer 21 wherein electric charge accumulates, is formed beneath the silicon dioxide layer 20. Also, a p+-type diffused region 22 for ohmic contact is formed on a surface of the p-type region 17. This diffused region 22 is connected to the p-type region 17 so as to impart a control voltage from the region 22 through the region 17 to the back face of the inversion layer 21. Namely, the region 17 serves as a so-called "back gate" electrode.

Instead of the abovementioned "back gate" electrode, an ordinary metal electrode covering the silicon dioxide layer 20 can be employed as the gate of the FET F1. Furthermore, a metal electrode covering the silicon dioxide film 20 connected to the region 17 can be employed, too.

Instead of the inversion layer 21 induced by the silicon dioxide layer 20, an ion-implanted thin conductive inversion layer can be used as the n-channel.

Then, by conventional inter-connection techniques using evaporated aluminum film, the drain region 13 and the gate region 22 are connected to the terminal 16, and the drain region 18 and the gate region 12 are connected to the other terminal 15. Thus, the device of FIG. 4 is connected as shown by the circuit diagram of FIG. 4a.

One example of the performance characteristic of the device of the abovementioned second example is as follows:

| | |
|---|---|
| Vth1: | 0.7V |
| Vth2: | 7V |
| Maximum current: | 0.6mA |
| Cut-off current: | below $10^{-9}$A |
| VB: | 25V |

FIG. 5 is a fragmental perspective view of another example of the present invention.

In this example, an n-channel FET F1 consisting of the drain region 28, the source region 29 and the gate region 25 and a p-channel FET F2 consisting of the drain region 26, the source region 27 and the gate region 28 are functionally connected in the manner as shown in FIG. 5a without aluminum inter-connections within the device. In FIG. 5, on a silicon substrate 7 of n-type conductivity, a p-type region 25 having surface impurity concentration of about $5 \times 10^{16}$ cm$^{-3}$ is formed. A pair of p+-type diffused regions 26 and 27 are formed in the p-type region 25, an n+-type region 28 is formed between the p+-type regions 26 and 27, and another n+-type region 29 is formed in a manner such that the p+-type region 27 lies between the n+-type region 28 and the n+ region 29, and that the n+-type region 29 contacts the n-type substrate 7. A pair of external connection terminals 15 and 16 are connected to the n+-type region 28 and the p+-type region 26, respectively. As mentioned above, the n+-type regions 28 and 29 constitute the drain and the source of the n-channel type FET F1, respectively. A surface inversion layer 21 having n-type conductivity is formed in the p-type region between the source region 29 and the drain region 28 by, for instance, ion-inplanting, and the inversion layer 21 constitutes the channel region controlled by signals imparted thereto through ohmic contact between the p+-type region 26 and the p-type region 25 which serves as a back gate electrode. The p+-type diffused regions 26 and 27 constitute the drain and the source of the p-channel junction-gate type FET F2, and the p-type region 25 constitute the channel region controlled by the n+-type diffused gate region 28. As can be understood from the foregoing description, the n+-type region 28 serves as both the drain of the n-channel FET F1 and the gate of the p-channel FET F2, thereby dispensing with aluminum inter-connections between the gate and the drain, and enabling the integration with high density. A metal layer, for instance, vapor-deposited aluminum layer 30, is formed so as to bridge and connect the p+-type source region 27 and the n+-type source region 29. Thus the composite device as shown in FIG. 5a is constituted.

Figure 5B:
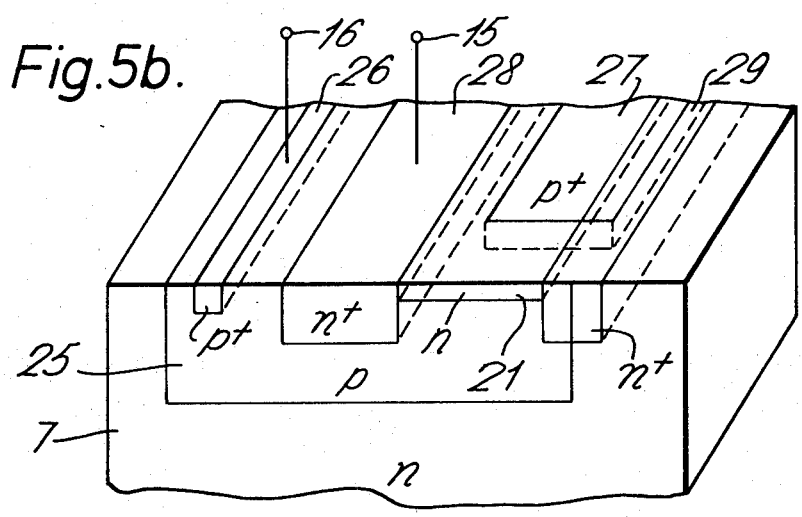
FIG. 5b is a fragmental perspective view of an example which is a variation from the example of FIG. 5.
Figure 5C:
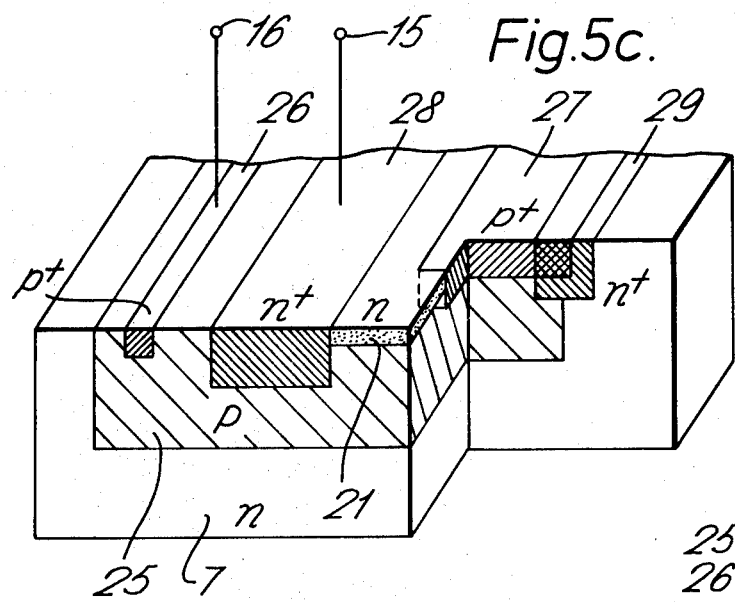
FIG. 5c is a further fragmental perspective view showing detailed construction of the example of FIG. 5b.
Figure 5D:
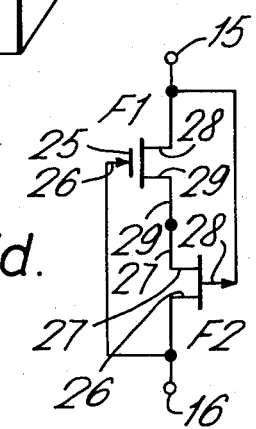
FIG. 5d is an equivalent circuit diagram of the device shown by FIGS. 5b and 5c.

FIG. 5b is a fragmental perspective view of an example modified from that of FIG. 5 and FIG. 5c is a further fragmental perspective view of the example of FIG. 5b, in order for showing details of superposed regions 27 and 29. In FIGS. 5b and 5c, instead of providing the metal layer 30 for connecting the p+-type region 27 and the n+-type region 29, the regions 27 and 29 are arranged so as to be partly superposed, hence connected, to each other. FIG. 5d is an equivalent circuit diagram of the device shown by FIGS. 5b and 5c. Thus, in this modified example, metallic interconnection can be completely eliminated, and hence, very high density integration of the circuit is attainable.

In the examples of FIG. 4, FIG. 5 and FIGS. 5b and 5c, the n-channel FET is of the type employing the surface inversion region as its channel region. Such inversion region channel type FET is easier to manufacture than unipolar transistors such as FETs with junction gate which require the art of controlling the depth of diffusion. Moreover, the n-channel FET employs back-gate type gate, and therefore, inter-connection of the device, namely, the connection between electrodes of the component FETs F1 and F2 can be made simpler, and consequently, the area necessitated for the composite device can be made smaller, hence enabling high density integration. Other items of advantages described for the example of FIG. 3 are also applicable to whole examples of the present invention.

This invention has an important feature that between the complementary depletion mode FET, namely the n-channel FET to be operated in depletion mode and the p-channel FET to be operated in depletion mode, there is no need of forming the isolation region. Such omission of the isolation region serves to minimize the area required for the composite device.

Many changes and modifications of the above mentioned embodiments of the invention can, of course, be carried out without departing from the scope thereof. Accordingly that scope is intended to be limited only by the scope of the appended claims.

What is claimed is:

1. A negative-resistance semiconductor device comprising:
    a semiconductor substrate region of a specified conductivity type,
    a pair of defined regions having the conductivity type opposite to that of said substrate region, and defined by p-n junctions from the substrate region,
    a first field-effect transistor of a surface inversion channel type to be operated in a depletion mode, made in one of said defined regions, and having a channel region consisting of a surface inversion layer,
    a second field-effect transistor of junction gate type to be operated in a depletion mode, and made in the other of said defined regions, and having a channel region consisting of said other defined region itself as the channel of opposite conductivity type to that of said inversion layer, the first and the second field-effect transistors being in complementary relation to each other, said transistors having gate, source and drain electrodes, and one of the source and drain electrodes of a first one of the complementary field-effect transistors being connected to one of the source and drain electrodes of a second one of the complementary field-effect transistors, the other electrode of said source and drain electrodes of the first one being connected to the gate of the second one, the other electrode of said source and drain electrodes of the second one being connected to the gate of the first one.

2. A negative-resistance semiconductor device comprising:

a semiconductor substrate of a specified conductivity type, a diffused defined region having the conductivity type opposite to that of said semiconductor substrate, a first pair of highly doped electrode regions made in said defined region and having the conductivity type same with that of the defined region, a second pair of highly doped electrode regions made in said defined region and having the conductivity type opposite to that of the defined region, said second pair of electrode regions being situated with a specified space inbetween, the space having a surface inversion region at the surface of said inbetween part on the defined region, thereby constituting a first field-effect transistor of inversion channel type with drain, source and gate, said electrode regions of the first pair being situated with another specified space inbetween having one of said electrode region of the second pair inbetween, thereby constituting a second field-effect transistor of junction gate type with drain, source and gate, a first lead-out conductor connected in ohmic relation to said one electrode region of second pair for leading out the drain of the first field-effect transistor and the junction gate of the second field-effect transistor, a second lead-out conductor connected in ohmic relation to said the other electrode region of the second pair for leading out the drain of the second field-effect transistor and a back-gate to the inversion channel of the first field-effect transistor.

3. A negative-resistance semiconductor device comprising a semiconductor substrate (6) of p-type conductivity, an epitaxial growth region (7) of n-type conductivity formed on one face of said substrate (6), a defined region (9) of a p-type conductivity formed by diffusion in the epitaxial growth region (7), and defined by a p-n junction from the epitaxial growth region (7), a first junction-gate type field-effect transistor (F1) of n-channel type to be operated in a depletion mode, and made in said epitaxial growth region (7), a second junction-gate type field-effect transistor (F2) of p-channel type to be operated in a depletion mode, made in said defined region (9), the first and the second field-effect transistors being complementary to each other, and the source electrode (11) of a first field-effect transistor (F1) being connected to the source electrode (14) of a second field-effect transistor (F2) by partly superposing their regions, the drain electrode (10) of the first FET (F1) being connected to the gate (12) of the second FET (F2), the drain electrode (13) of the second FET (F2) being connected to the gate (8) of the first FET (F1).

4. A negative-resistance semiconductor device comprising:

a semiconductor substrate region (7) of a specified conductivity type, a pair of defined regions (9, 17), having the conductivity type opposite to that of said substrate region (7), and defined by p-n junctions from the substrate region (7), a first field-effect transistor (F1) of a surface inversion channel type to be operated in a depletion mode, formed in one (17) of said defined regions, and having a channel region (21) consisting of a surface inversion layer and gate, (22), source (19) and drain (18) electrodes, a second field-effect transistor (F2) of junction gate type to be operated in a depletion mode, formed in the other one (9) of the defined regions and having gate (12), drain (13) and source (14) electrodes, the lower part of said defined region (9) constituting the p-type channel, the first and the second field-effect transistors being in complementary relation to each other, and the source electrode (19) of the first field-effect transistors being connected to the source electrode (14) of the second field-effect transistors by overlapping extended parts of said two source electrodes (19, 14) each other extending on the substrate region (7), the drain of the first field-effect transistor (F1) being connected to the gate of the second one, the drain of a second field-effect transistor (F2) being connected to the gate of the first one.

5. A negative-resistance semiconductor device comprising:

a semiconductor substrate (7) of n-type conductivity, a diffused defined region (25) having p-type conductivity, a first pair of highly doped p+-type electrode regions (26 and 27) formed in said defined region (25), a second pair of highly doped n+-type electrode regions (28, 29) formed in said defined region (25), said second pair of electrode regions (28, 29) being situated with a specified space inbetween, the space having a n-type surface inversion region (21) at the surface of said inbetween, part on the defined region (25), thereby constituting a first field-effect transistor (F1) of n-type inversion channel type with drain (28), source (29) and gate (25), said electrode regions (26, 27) of the first pair being situated with another specified space inbetween having one of said electrode region (28) of the second pair inbetween, thereby constituting a second field-effect transistor F2 of junction gate type with drain (26), source (27) and gate (28), the source (27) of said second field-effect transistor (F2) being connected to the source (29) of said first field-effect transistor (F1), a first lead-out conductor (15) connected in ohmic relation to said drain (28) of the first field-effect transistor (F1) also serving as the gate (28) of the second field-effect transistor (F2),
a second lead-out conductor (16) connected in ohmic relation to the drain (26) of the second field-effect transistor (F2) also serving as the gate (25) of the type of a back-gate to the inversion channel (21) of the first field-effect transistor (F1).

* * * * *

UNITED STATES PATENT OFFICE
CERTIFICATE OF CORRECTION

Patent No. 4,064,525  Dated December 20, 1977

Inventor(s) Gota KANO, Naoyuki TSUDA & Hitoo IWASA

It is certified that error appears in the above-identified patent and that said Letters Patent are hereby corrected as shown below:

In the heading:

Item [73], change "Matsushita Electric Industrial Co., Ltd." to -- Matsushita Electronics Corporation --

Signed and Sealed this

Eighteenth Day of April 1978

[SEAL]

Attest:

RUTH C. MASON
Attesting Officer

LUTRELLE F. PARKER
Acting Commissioner of Patents and Trademarks